United States Patent [19]

Nomura et al.

[11] Patent Number: 4,901,227
[45] Date of Patent: Feb. 13, 1990

[54] MICROCOMPUTER SYSTEM

[75] Inventors: Masahiro Nomura; Yukio Maehashi, both of Tokyo, Japan

[73] Assignee: NEC Corporation, Tokyo, Japan

[21] Appl. No.: 89,871

[22] Filed: Aug. 27, 1987

[30] Foreign Application Priority Data

Aug. 27, 1986 [JP] Japan .............................. 61-202232

[51] Int. Cl.⁴ ........................... G11C 7/00; G06F 9/22
[52] U.S. Cl. .................................................. 364/200
[58] Field of Search ................. 364/200, 900; 365/230

[56] References Cited

U.S. PATENT DOCUMENTS

| | | | |
|---|---|---|---|
| 4,660,180 | 4/1987 | Tanimura et al. | 365/230 |
| 4,660,181 | 4/1987 | Saito et al. | 365/230 |
| 4,677,592 | 6/1987 | Sakurai et al. | 365/230 |
| 4,679,173 | 7/1987 | Sato | 365/230 |
| 4,685,089 | 8/1987 | Patel et al. | 365/233 |
| 4,688,197 | 8/1987 | Novak et al. | 365/230 |
| 4,723,226 | 2/1988 | McDonough et al. | 365/230 |
| 4,736,344 | 4/1988 | Yanagisawa | 365/230 |
| 4,747,045 | 5/1988 | Harrigai et al. | 364/200 |

OTHER PUBLICATIONS

Thomas W. Starnes, "Design Philosophy Behind Mc 68000", Byte Magazine, April, 1983, AR208, pp. 1-8.

Primary Examiner—Andrew J. James
Assistant Examiner—Viet Q. Nguyen
Attorney, Agent, or Firm—Foley & Lardner, Schwartz, Jeffery, Schwaab, Mack, Blumenthal & Evans

[57] ABSTRACT

A microcomputer system comprises a microprocessor and a memory chip which has on a single semiconductor substrate a pointer for indicating an address of an instruction code fetch destination, an incrementer for incrementing the pointer and a memory for storing programs and data. The microprocessor controls the update timing of the pointer in the memory chip, so that the instruction codes can be continuously read from the memory of the memory chip without outputting the addresses of the instruction code fetch destination from the microprocessor.

20 Claims, 10 Drawing Sheets

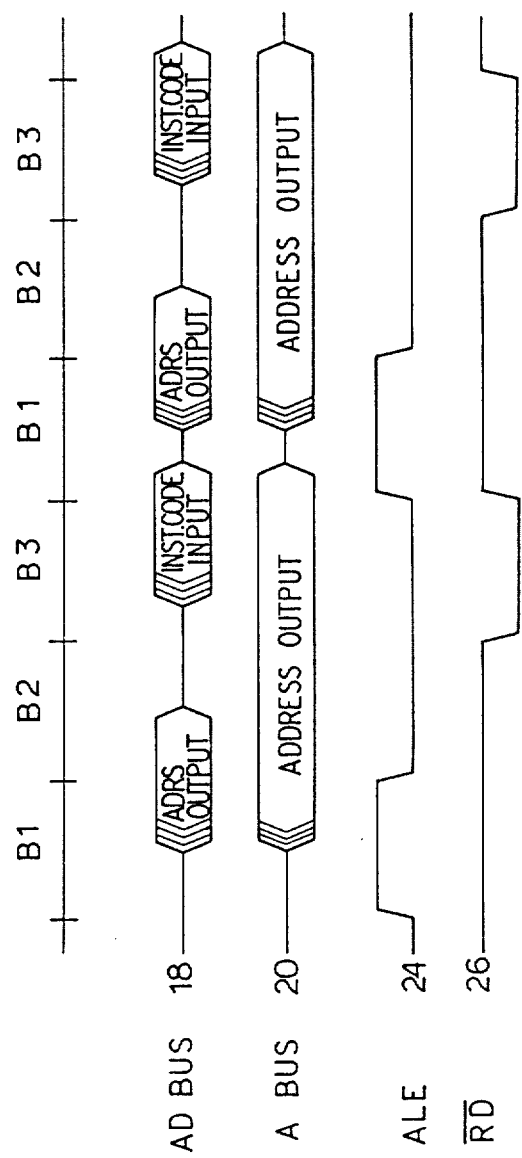

MICROCOMPUTER SYSTEM

BACKGROUND OF THE INVENTION

1. Field of the Invention

The present invention relates to a microcomputer system including a microprocessor and a memory.

2. Description of related art

At present, the performance of microprocessors has been greatly improved by an operation frequency increased by improvement in semiconductor device manufacturing processes and by improvement in architecture such as pipelined systems. Therefore, the current processors can execute given instructions at a very high speed. However, considering a microcomputer system having a microprocessor as a central device and other peripheral input/output devices, a remarkable improvement cannot be found out in the performance of the overall microcomputer system for the following reason: Although the microprocessor itself can operate at a very high speed, since the speed of access to the memory is limited, the fetch of instruction codes cannot follow the execution of instructions in the microprocessor. Specifically, a so-called "bus neck" will occur.

If the bus neck occurs, not only the advantage of the prefetch of instruction codes given by an instruction queue cannot obtained, but also the instruction execution itself of the microprocessor is put in a wait condition for shortage of instruction codes in the instruction queue. Alternatively, if the fetch cycle for instruction codes is preferentially started, the data read/write cycle to be executed with execution of an instruction will be delayed, with the result that the time of instruction execution will be elongated. The above defects will waste the hardware resource for execution of instruction, and will decrease the performance of the overall system.

Furthermore, it is necessary to provide additional circuits such as latches and drivers between the microprocessor and the memory chip. This will decrease the economic efficiency of the system, and the increase of the number of parts will also decrease the reliability of the system.

SUMMARY OF THE INVENTION

Accordingly, it is an object of the present invention to provide a microprocessor system which has overcome the defects as mentioned above.

Another object of the present invention is to provide a microcomputer system which can operate at a high instruction execution speed in the overall system with a decreased occurrence of the bus neck.

A further object of the present invention is to provide a microcomputer system which can effectively ensure the advantage given by the prefetch of instruction codes.

A still further object of the present invention is to provide a microcomputer system having a microprocessor chip and a memory chip directly coupled with each other without the intermediary of additional devices such as latches and drivers.

The above and other objects of the present invention are achieved in accordance with the present invention by a microcomputer system which comprises memory unit for storing various kinds of processing data and programs, a unit for processing data by executing instructions in accordance with the programs stored in the memory unit, a unit for controlling transfer of processing data between the memory unit and the data processing unit and transfer of the programs from the memory units, a unit for storing instruction codes of the programs read from the memory unit in advance of the execution of instructions, indicator unit for storing information indicating the content of the memory unit, and a unit for updating the content of the indicator unit. The transfer control means includes a first transfer a unit for performing a one-time data transfer between the memory unit and the data processing unit, following the delivery of the information indicating a read/write destination in the data transfer between the memory unit and the data processing unit, a second transfer unit for transferring an instruction to the instruction storing unit from the memory unit designated by the indication information stored in the indicator unit, following the delivery of the indication information to the indicator unit, and a third transfer unit for outputting an update control signal to the update unit so as to update the content of the indicator unit so that a continuous transfer is performed from the memory unit to the instruction storing unit. The transfer control unit operates to select the first, second and third transfer unit in a predetermined preferential order on the basis of a status of instruction execution in the data processing unit and a status of storage in the instruction storing unit, so that the transfer of the processing data between the memory unit and the data processing unit and the transfer of the program from the memory unit are optimized.

The above and other objects, features and advantages of the present invention will be apparent from the following description of preferred embodiments of the invention with reference to the accompanying drawings.

BRIEF DESCRIPTION OF THE DRAWING

FIGS. 2, 3A, 3B, 4 and 5 are timing charts illustrating the operation of the system shown in FIG. 1;

DESCRIPTION OF THE PREFERRED EMBODIMENTS

Figure 1:
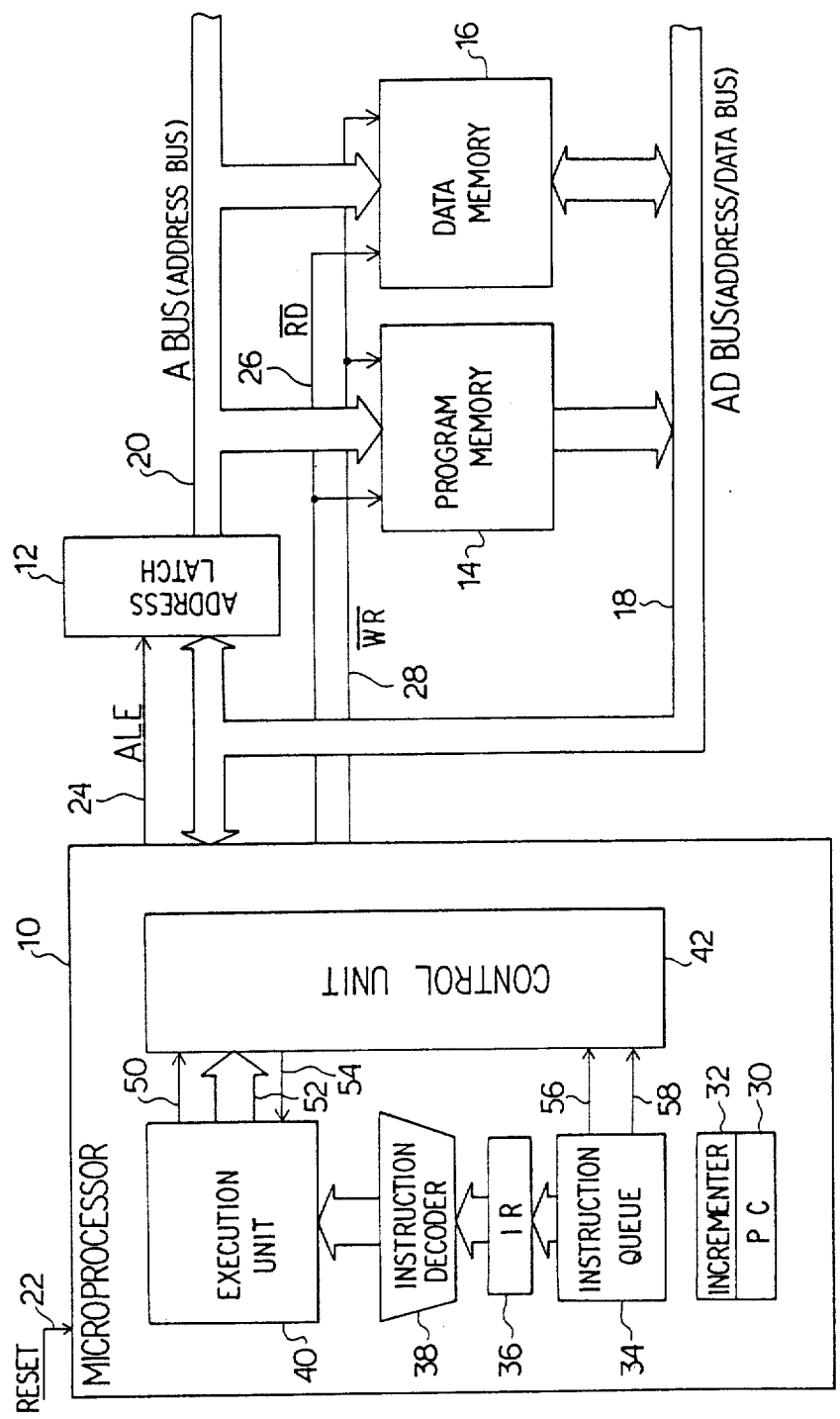
FIG. 1 is a block diagram of a conventional microcomputer system comprising a microprocessor, a program memory and a data memory.

Referring to FIG. 1, there is shown a block diagram of one conventional microcomputer system composed of a microprocessor, a program memory and a data memory.

The shown microcomputer system includes a microprocessor 10 for controlling input/output of data, arithmetic and logic operation and the entire operation of the overall microcomputer system. Further, the system includes an address latch 12 receiving and demultiplexing multiplexed address, instruction codes and input/output data inputted to and outputted from the microprocessor 10, a program memory 14 storing programs executed by the microprocessor, and a data memory 16 for storing processing data of the microprocessor 10. The above units are coupled as shown by an address- /data bus (called "AD bus" hereinafter) 18 for transferring multiplexed data composed of address, instruction code and input/output data, and an address bus (called "A bus" hereinafter) 20 for transferring the address demultiplexed by the address latch 12 from the information on the AD bus 18.

Specifically, the microprocessor 10 includes a program counter (called "PC" hereinafter) 30 indicating an address in the program memory 14 which stores an instruction code to be executed next, an incrementer 32 for incrementing the program counter 30, and an instruction queue 34 for storing instruction codes prefetched from the program memory 14. The microprocessor 10 also includes an instruction register (called "IR" hereinafter) 36 for holding an instruction code read from the instruction queue 34, an instruction decoder 38 for decoding the instruction code held in the instruction register 36 so as to output various control signals necessary for execution of instruction, an execution unit 40 receiving the control signals from the instruction decoder 38 for executing an instructed processing, and an execution control unit 42 for controlling the whole operation of the microprocessor 10.

The execution unit 40 outputs to the control unit 42 a bus request signal (called "BRQ signal" hereinafter) 50 for requiring the start of a data read/write cycle between the data memory 16 and the microprocessor 10 accompanied by the execution of an instruction, and an address 52 for specifying the access destination of the data memory 16. In response to a data read/write cycle start request or a branch cycle start request, the control unit 42 will output an acknowledge signal (called "ACK signal" hereinafter) 54. Further, the instruction queue 34 outputs to the control unit 42 a ready queue signal (called "QRDY signal" hereinafter) 56 indicating that a suitable member of instruction codes are stored in the instruction queue 34 and these codes are readable, and a queue full signal (called "QFUL signal" hereinafter) 58 indicating that the instruction queue 34 is filled with instruction codes.

The microprocessor 10 is adapted to carry out the read of the instruction code from the program memory 14 and the read/write of the data to and from the data memory 16 through the address/data bus 18 through which the multiplexed address and input/output data are transferred.

On the other hand, the microprocessor 10 receives, as one input control signal, a reset signal 22 for initializing the hardwares in the microprocessor 10. The microprocessor 10 outputs, as output control signals, an address latch enable signal (called "ALE signal" hereinafter) 24 for defining a timing at which the address latch 12 latches the address information on the address/data bus 18, a read signal (called "$\overline{RD}$ signal" hereinafter) for the data read of the microprocessor 10 from the data memory 16 and the fetch of the instruction code from the program memory 14, and a write signal (called "$\overline{WR}$ signal" hereinafter) 28 for the writing of the data to the data memory 16. Here, the $\overline{RD}$ signal 26 and the $\overline{WR}$ signal 28 are active at a low level.

Next, explanation will be made on a bus cycle operation of the microcomputer system explained above.

A bus cycle of the microprocessor 10 is constituted of three basic operation states and an empty state each of which is composed of a plurality of clocks. The control unit 42 outputs three reference timing signals B1, B2 and B3 for the bus cycle and a BI signal indicating that the bus cycle is in empty. With these signals, the bus cycles for the instruction code fetch cycle and the data read/write cycle are controlled by the control unit 42.

Figure 3A:
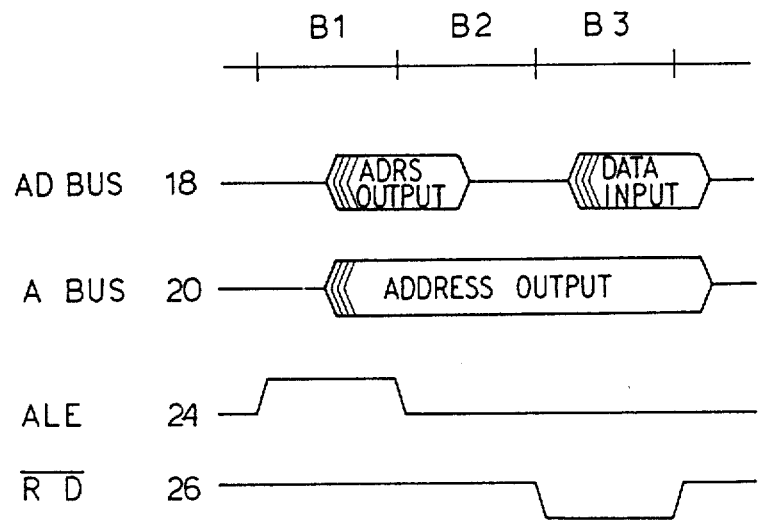
Figure 3B:
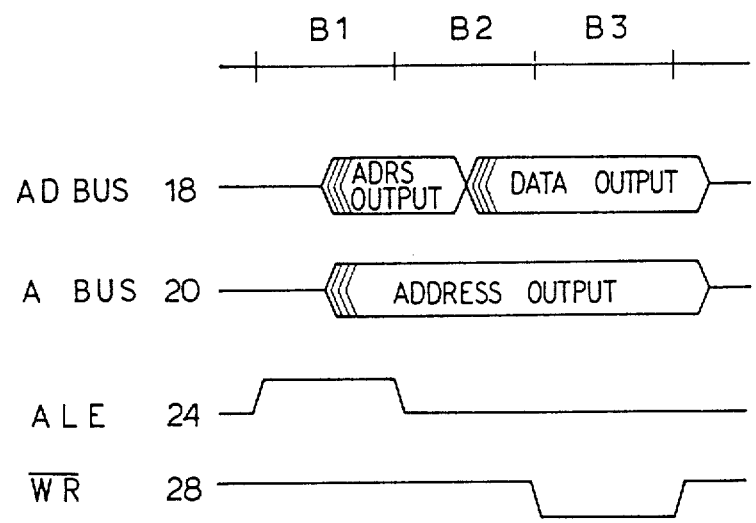

Now, operation will be described with reference to timing charts of two basic bus cycles. FIG. 2 shows a timing chart of the instruction code fetch cycle. FIG. 3A shows a timing chart of the data read cycle, and FIG. 3B shows a timing chart of the data write cycle.

(1) Instruction code fetch cycle

The instruction code fetch cycle is composed of three timing signals B1, B2 and B3.

The processor 10 rises up the ALE signal 24 at the timing B1. In order to avoid contention on the address/data bus 18 with the data in the preceding bus cycle, an address information for an instruction code to be read next in the program memory 14 is outputted from the program counter 30 to the address/data bus 18 in the latter half of the timing period B1. Thereafter, the ALE signal 24 is fallen down at a tail edge of the timing signal B1. The address latch 12 latches the address on the address/data bus 18 at the falling of the ALE signal 24. During the timing periods B2 and B3, the address information is outputted from the address latch 12 to the address bus 20.

In the latter half of the timing period B2, the microprocessor 10 brings the address/data bus 18 into a floating condition for preparation of the instruction code fetch cycle. Thereafter, during the timing period B3, the $\overline{RD}$ signal 26 is made active. With this, data is outputted onto the address/data bus 18 from a location of the program memory 18 designated by the address on the address bus 20.

At a predetermined clock during the timing period B3 at which the instruction code read onto the address/data bus 18 becomes valid, the microprocessor 10 causes the instruction queue 34 to fetch the instruction code on the address/data bus 18.

(2) Data read/write cycle

The data read/write cycle is composed of three timing periods B1, B2 and B3, similarly to the instruction code fetch cycle.

The processor 10 rises up the ALE signal 24 in the timing period B1. In order to avoid contention on the address/data bus 18 with the data in the preceding bus cycle, an address information of the access destination in the data memory 16 outputted from the execution unit 40 to the address bus 52 is outputted to the address/data bus 18 in the latter half of the timing period B1. Thereafter, the ALE signal 24 is fallen down at a tail edge of the timing signal B1. The address latch 12 latches the address on the address/data bus 18 at the falling of the ALE signal 24. During the timing periods B2 and B3, the address information of the access destination in the data memory 16 is outputted from the address latch 12 to the address bus 20.

In the case of data read cycle, in the latter half of the timing period B2, the microprocessor 10 brings the address/data bus 18 into a floating condition for preparation of the read cycle. Thereafter, during the timing period B3, the $\overline{RD}$ signal 26 is made active. With this, data is outputted onto the address/data bus 18 from a location of the data memory 16 designated by the address on the address bus 20.

At a predetermined clock during the timing period B3 at which the data read onto the address/data bus 18 becomes valid, the microprocessor 10 fetches the data on the address/data bus 18.

In the case of the data write cycle, the microprocessor 10 makes the $\overline{WR}$ signal 28 active during the timing period B3 and at the same time outputs the write data on the address/data bus 18. At a predetermined clock during the timing period B3 at which the data on the address/data bus 18 becomes valid, the data on the address/data bus 18 is written into the data memory 16 at a location designated by the address on the address bus 20.

As mentioned above, the fetch cycle of the instruction code from the program memory 14 and the read/write cycle of the data to and from the data memory for execution of a given instruction are executed in the same number of the bus cycles. Specifically, any of the instruction code fetch, the data read and the data write is executed in one bus cycle composed of the timing periods B1, B2 and B3.

The control unit 42 controls the output timing of the reference timing signals B1, B2, B3 and BI on the basis of the status of the QRDY signal 56 and the QFUL signal 58 from the instruction queue 34 and the BRQ signal 50 from the execution unit 40. Also, the control unit 42 controls a preferential order of the bus cycle start between the data read/write cycle and the instruction code fetch cycle.

Figure 4:
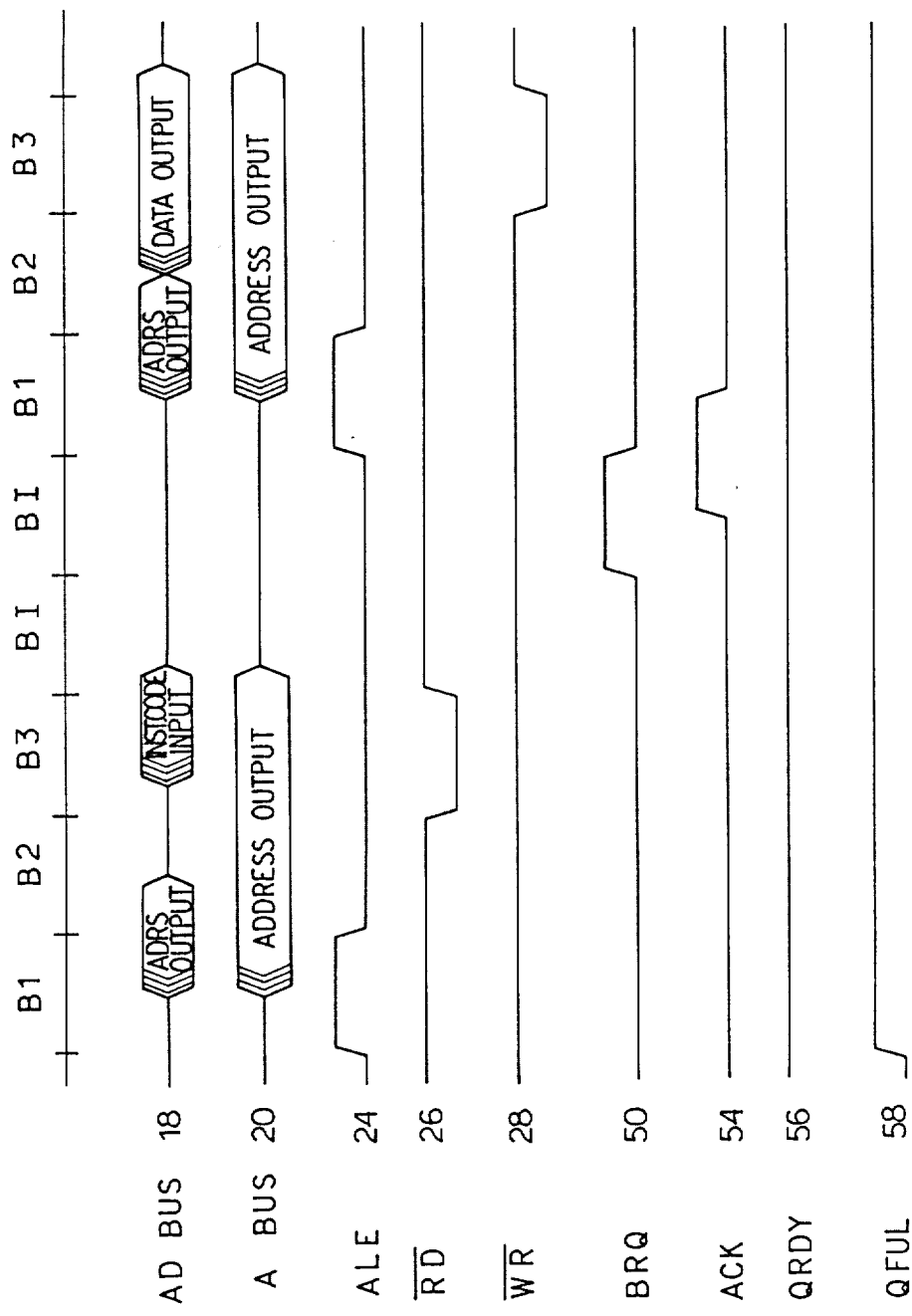
Figure 5:
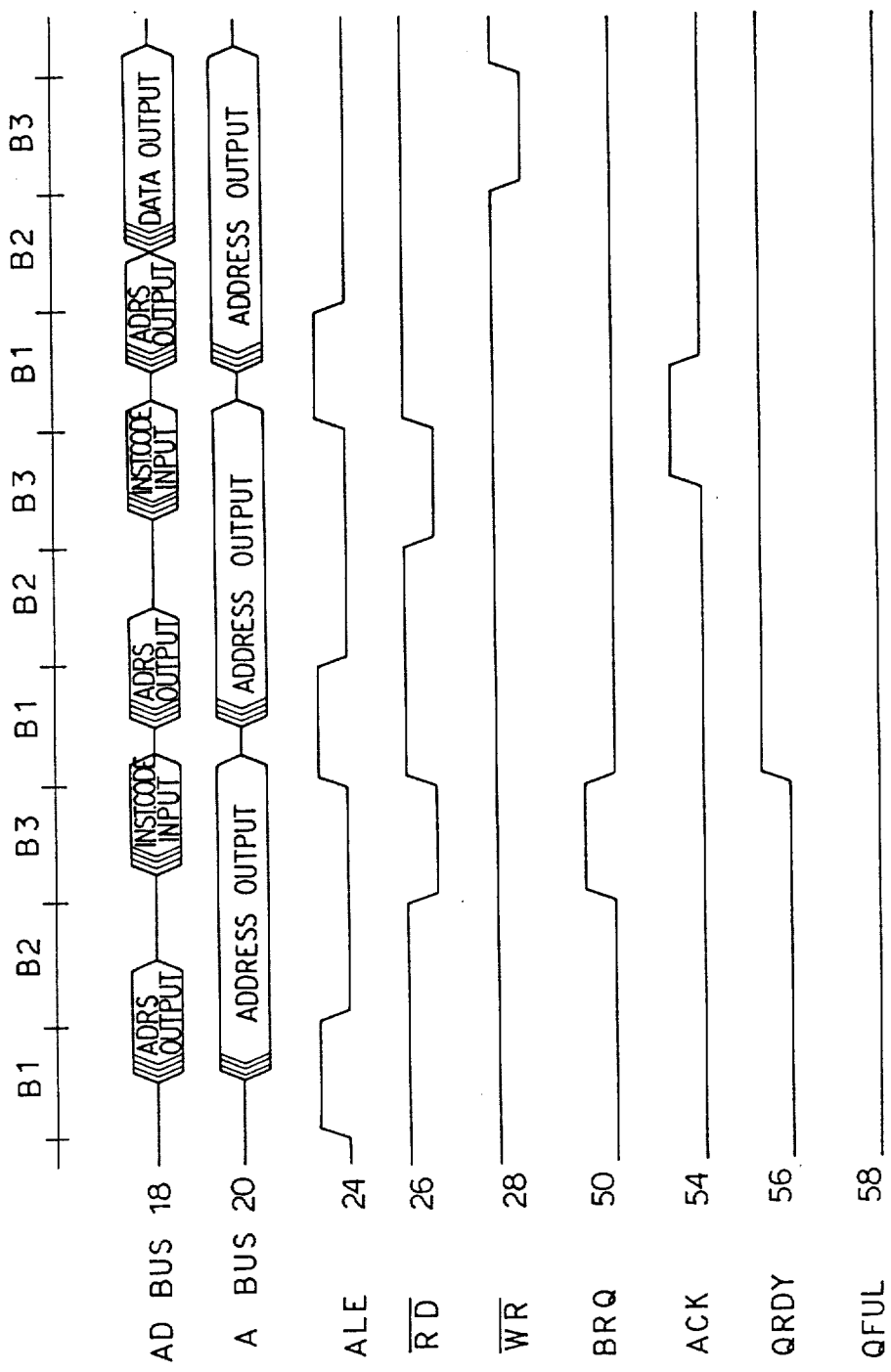

Next, the operation of the control unit will be explained with reference to timing charts. FIG. 4 shows a timing chart of various signals in the case of an inactive QRDY signal 56, and FIG. 5 shows a timing chart of various signals in the case of an active QRDY signal 56.

(1) In the case of an active QRDY signal 56

In this case, the instruction code fetch cycle is started during an inactive period of the BRQ signal 50 until the instruction queue 34 generates the QFUL signal 58 indicating that the instruction queue 34 is filled with the instruction codes. If the instruction queue 34 brings the QFUL signal 58 into an active condition, the control unit 42 outputs the signal BI so as to maintain the bus cycle in an idle state until the BRQ signal 50 becomes active or until the QFUL signal 58 becomes inactive again. In the case that the BRQ signal 50 has become active, since the data read/write cycle has the start preferential order higher than that of the instruction code fetch cycle, the data read/write cycle is started immediately after completion of the bus cycle being executed at that time (if it is).

As seen from FIG. 4, FIG. 4 illustrates the case that the data write cycle is granted during the period BI.

(2) In the case of an inactive QRDY signal 56

In this case, the instruction code fetch cycle is repeatedly started irrespectively of the status of the BRQ signal 50.

In this situation, since the instruction code fetch cycle is given a start preferential order higher than that of the data read/write cycle, although the BRQ signal becomes active, the instruction code fetch cycles is continuously repeated until the QRDY signal becomes active. Specifically, the start of the data read/write cycle is kept waiting. FIG. 5 illustrates the case that the start of the data write cycle is waited until the QRDY signal 56 becomes active.

In the microcomputer system as mentioned above, the number of cycles necessary for the bus cycles of the instruction code fetch and the data read/write is large because of a limitation defined by access speed to the memory and an inevitable multiplexing of address and data adopted by a limited pin number of a package. As a result, the time required for instruction code fetch has become long in comparison to the instruction execution time in the microprocessor. Specifically, the frequency of the bus neck occurrence is high.

If the bus neck occurs, not only the advantage of the prefetch of instruction codes given by an instruction queue cannot obtained, but also the instruction execution itself of the microprocessor is put in a wait condition for shortage of instruction codes in the instruction queue. In addition, since the fetch cycle for instruction codes is preferentially started by the microprocessor, the data read/write cycle to be executed with execution of an instruction will be waited, with the result that the time of instruction execution will be made long. The above defects will waste the hardware resource for execution of instruction, and will decrease the performance of the overall system.

Furthermore, since it is necessary to provide additional circuits such as latches and drivers between the microprocessor and the memory chips, the economic efficiency of the system is decreased, and the increase of the number of parts will also decrease the reliability of the system.

Figure 6:
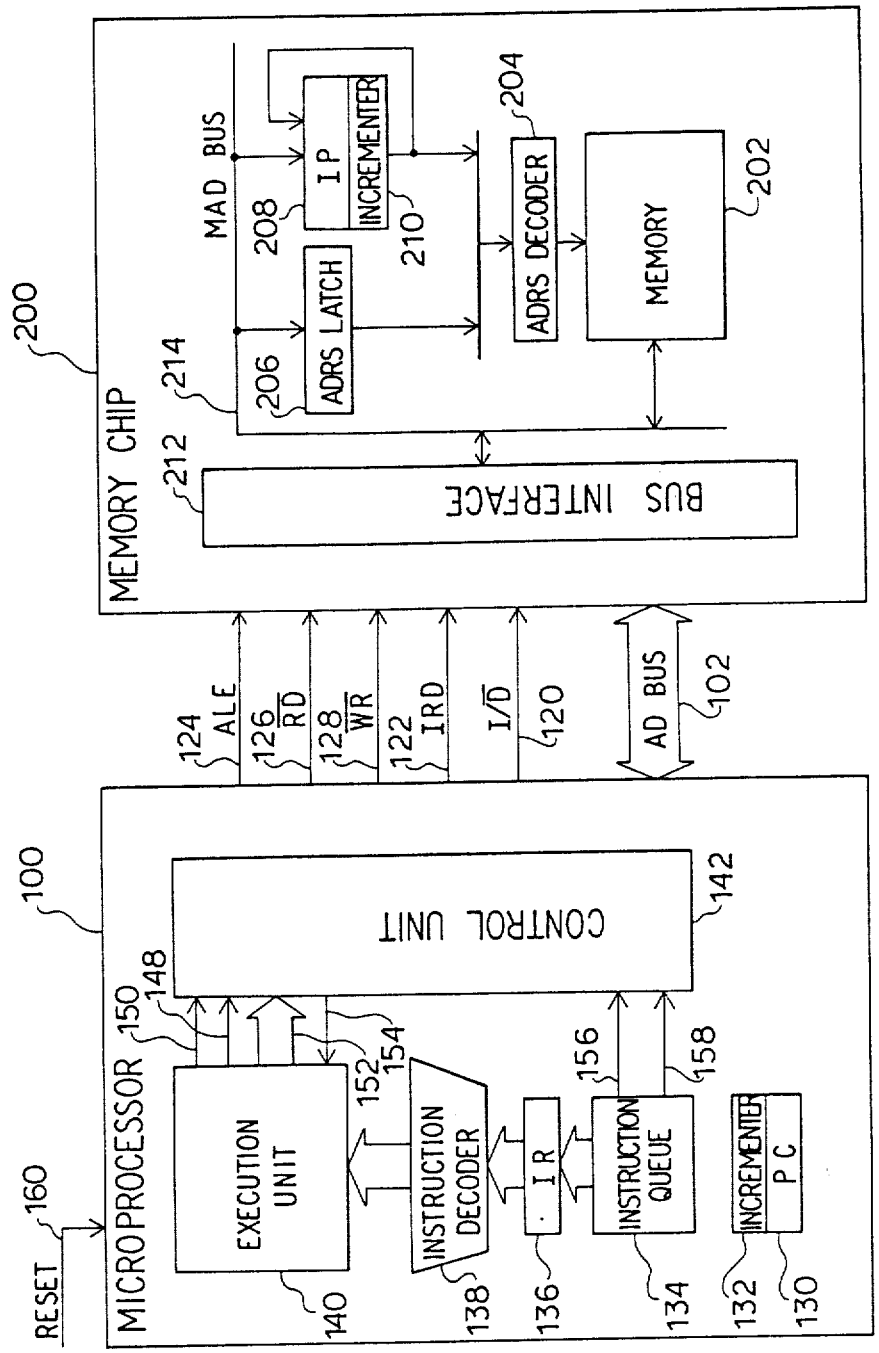
FIG. 6 is a block diagram of a first embodiment of the microprocessor system in accordance with the present invention.

Turning to FIG. 6, there is shown a block diagram of one embodiment of the microprocessor system in accordance with the present invention.

The shown microcomputer system includes a microprocessor chip 100 for controlling input/output of data, arithmetic and logic operation and whole operation of the overall microcomputer system, and a memory chip 200 containing therein a memory 202 for storing programs executed by the microprocessor 100 and the processing data necessary for the execution of the instructions.

Specifically, the microprocessor 100 includes a program counter (called "PC" hereinafter) 130 indicating an address in the memory 202 which stores an instruction code to be executed next, an incrementer 132 for incrementing the program counter 130, and an instruction queue 134 for storing instruction codes prefetched from the memory 202. The microprocessor 100 also includes an instruction register (called "IR" hereinafter) 136 for holding an instruction code read from the instruction queue 134, an instruction decoder 138 for decoding the instruction code held in the instruction register 136 so as to output various control signals necessary for execution of instruction, an execution unit 140 receiving the control signals from the instruction decoder 138 for executing an instructed processing, and an execution control unit 142 for controlling the whole operation of the microprocessor 100.

The execution unit 140 outputs to the control unit 142 a bus request signal (called "BRQ signal" hereinafter) 150 for requiring the start of a data read/write cycle between the memory 202 and the microprocessor 100 for the execution of an instruction, a branch signal (called "BR signal" hereinafter) 148 for requesting the start of a branch operation cycle, and an address 152 for specifying the access destination of the memory 202 or the branch destination. In response to a data read/write cycle start request or a branch cycle start request, the control unit 142 will output an acknowledge signal (called "ACK signal" hereinafter) 154. Further, the instruction queue 134 outputs to the control unit 142 a ready queue signal (called "QRDY signal" hereinafter) 156 indicating that a suitable number of instruction codes are stored in the instruction queue 134 and these codes are readable, and a queue full signal (called "QFUL signal" hereinafter) 158 indicating that the instruction queue 134 is filled with instruction codes.

The microprocessor 100 is coupled to an address-/data bus (AD bus) 102 through which the address and the input/output data are transferred in a multiplexed manner, so that the microprocessor 100 carries out the read of the instruction code from the memory 202 and the read/write of the data to and from the memory 202 through the AD bus 102.

On the other hand, the memory chip 200 includes the above mentioned memory 202 for storing the programs executed by the microprocessor 100 and the processing data of the microprocessor 100, and an address decoder 204 for selecting a cell contained in the memory 202. Further, the memory chip 200 includes an address latch 206 receiving and demultiplexing the multiplexed address and input/output data transferred through the AD bus 102, an instruction pointer (called "IP" hereinafter) 208 indicating the address of the memory 202 which stores an instruction code to be executed next by the microprocessor 200, and an incrementer 210 for incrementing the instruction pointer 208. In addition, there is also provided a bus interface 212 for controlling the operation of various units contained in the memory chip 200 on various control signals supplied from the microprocessor 100 as will be explained hereinafter. The above mentioned units are coupled as shown by a memory address/data bus (called "MAD bus" hereinafter) 214, and are installed on one single semiconductor chip.

Furthermore, the microprocessor 100 receives, as one input control signal, a reset signal 160 for initializing the hardwares in the microprocessor 100. The microprocessor 100 outputs, as output control signals, an address latch enable signal (called "ALE signal" hereinafter) 124 for defining a timing at which the address latch 206 latches the address information on the MAD bus 214, a read signal (called "$\overline{\text{RD}}$ signal" hereinafter) 126 for the data read of the microprocessor 100 from the memory 202 and the fetch of the instruction code from the memory 202, and a write signal (called "$\overline{\text{WR}}$ signal" hereinafter) 128 for the writing of the data to the memory 202. The microprocessor 100 also outputs an instruction read signal (called "IRD signal" hereinafter) 122 for defining a timing at which the incrementer 210 carries out its increment operation for fetching of an instruction code for the next instruction, and a timing at which the address obtained by the increment operation is written into the instruction pointer 208. Further, the microprocessor 100 outputs an instruction/data signal (called "I/$\overline{\text{D}}$ signal" hereinafter) 120 for designating one of the address latch 206 and the instruction pointer 208 as an address source to the address decoder 204. The $\overline{\text{RD}}$ signal and the $\overline{\text{WR}}$ signal are active at a low level. When the I/$\overline{\text{D}}$ signal is at a high level, it designates the instruction pointer 208 so that the instruction pointer 208 is coupled to the address decoder 204. When the I/$\overline{\text{D}}$ signal is at a low level, the address latch 206 is selected to be coupled to the address decoder 204.

In addition, the address space of the microprocessor 100 is a single address space in which a program space and a data space are not clearly separated. Therefore, the programs and the data are stored in a mixed condition in the memory 202 of the memory chip 200.

Now, explanation will be made on a bus cycle operation of the microcomputer system shown in FIG. 6.

A bus cycle of the microprocessor 100 is constituted of three basic operation states and an empty state each of which is composed of a plurality of clocks. The control unit 142 outputs three reference timing signals T1, T2 and T3 for the bus cycle and a TI signal indicating that the bus cycle is in empty. On the basis of these reference timing signals, the control unit 142 generates the above mentioned various control signals to the memory chip 200 to control the bus cycles for the instruction code fetch cycle and the data read/write cycle.

Figure 7:
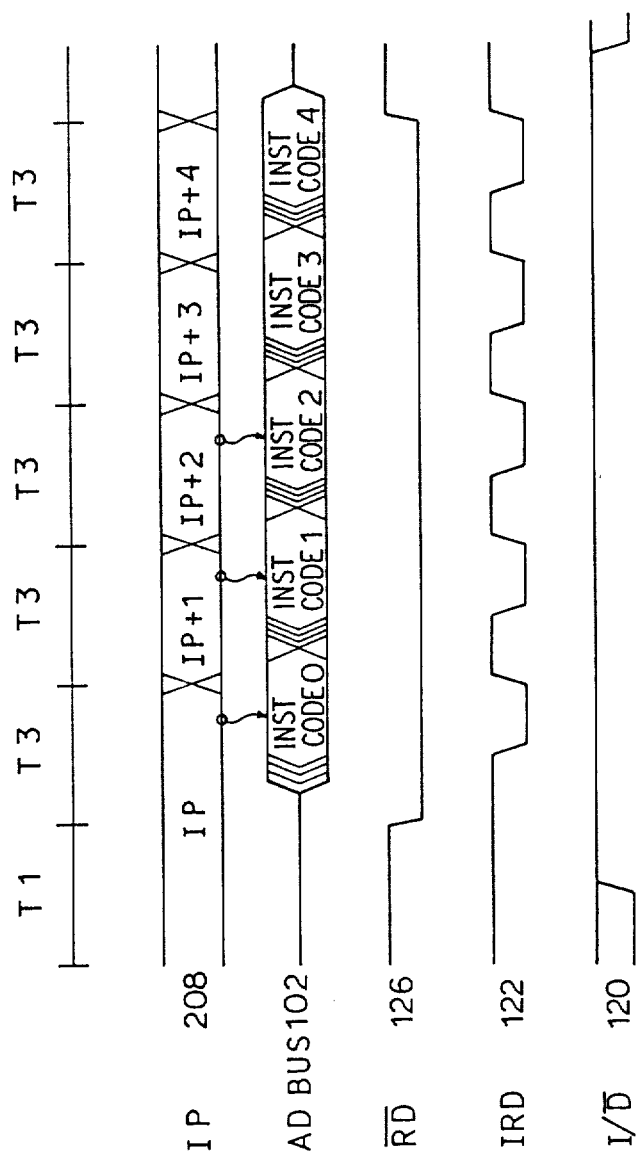
FIGS. 7, 8A, 8B and 9 are timing charts illustrating the operation of the system shown in FIG. 6.
Figure 8A:
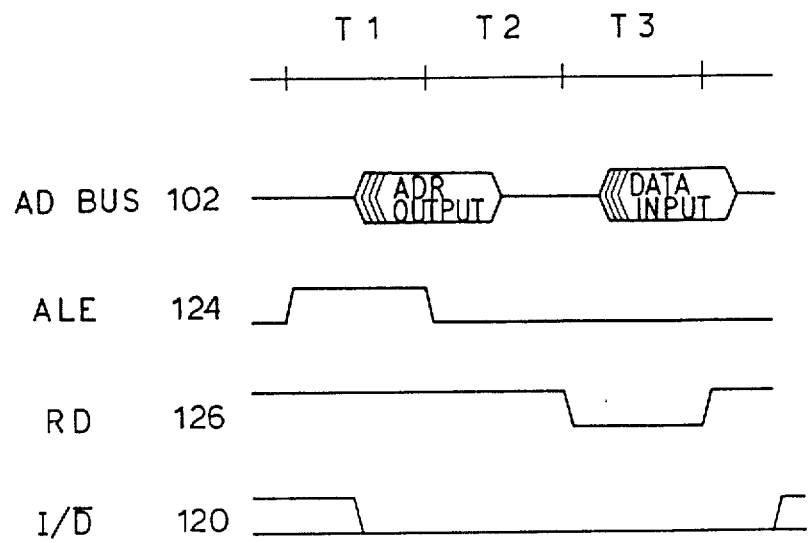
Figure 8B:
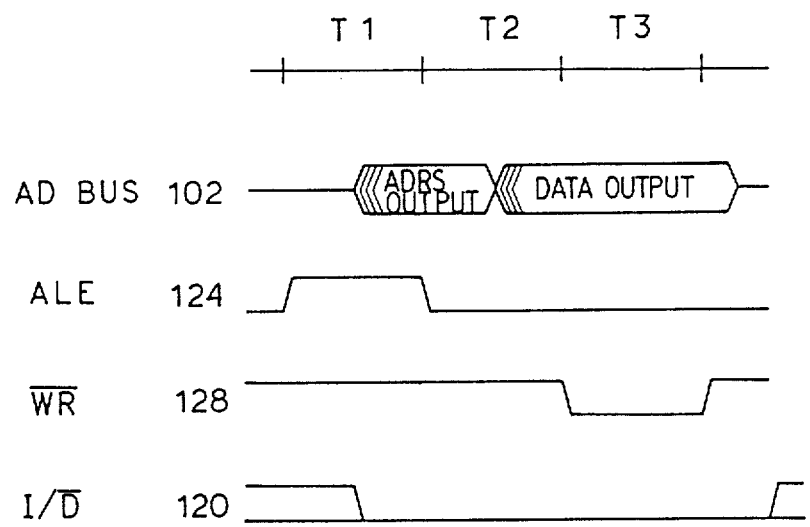
Figure 9:
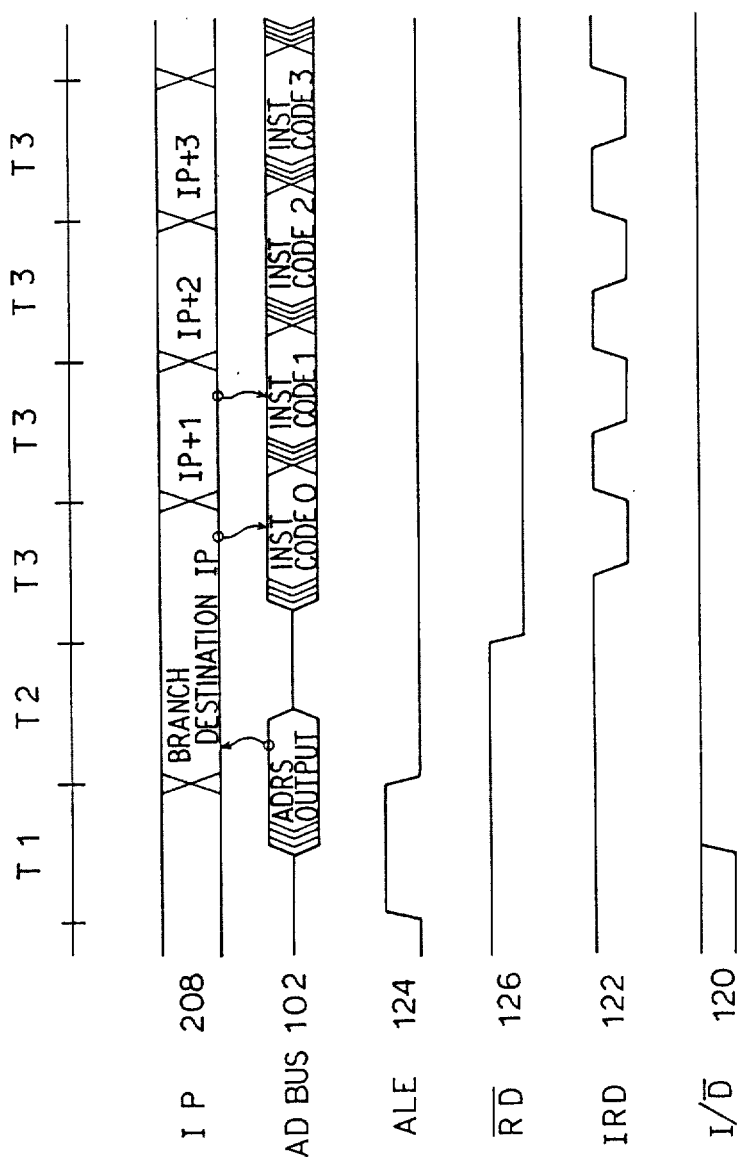

Now, operation will be described with reference to timing charts of three basic bus cycles. FIG. 7 shows a timing chart of the instruction code fetch cycle. FIG. 8A shows a timing chart of the data read cycle, FIG. 8B shows a timing chart of the data write cycle, and FIG. 9 shows a timing chart of the branch processing cycle.

(1) Instruction code fetch cycle

The instruction code fetch cycle is composed of one timing period T1 and continuous timing periods T3.

The control unit 143 of the microprocessor 100 makes all the control signals inactive in order to avoid contention with the preceding bus cycle.

Then, the control unit 142 brings the I/$\overline{\text{D}}$ signal 120 to the high level at the latter half of the timing period T1. With this, the instruction pointer 208 is selected as an address source to the memory 202 of the memory chip 200, and so, the bus interference 212 controls to cause the value of the instruction pointer 208 to be coupled to the address decoder 204.

Further, the control unit 142 makes the $\overline{\text{RD}}$ signal active during the timing periods T3, so that the bus interface 212 outputs the instruction code stored in the memory 202 and designated by the instruction pointer 208, through the MAD bus 214 to the AD bus 102.

At a predetermined clock during the timing period T3 at which the instruction code read onto the AD bus 102 becomes valid, the control unit 142 of the microprocessor 100 causes the instruction queue 134 to fetch the instruction code on the AD bus 102. At the same time, the control unit 142 falls down the IRD signal 122 in the latter half of the timing period T3, and then rises up the same IRD signal 122 at the trial edge of the timing period T3 again.

Thus, the bus interface 212 of the memory chip 200 causes the address value of the instruction pointer 208 to be outputted to the incrementer 210 at the falling-down of the IRD signal 122 so that the incrementer 210 executes the increment operation. Then, at the rising-up of the IRD signal 122, the bus interface 212 causes a new address value obtained by the increment operation to be written into the instruction pointer 208 so that the instruction pointer 208 is updated.

Thereafter, during the continuous timing periods T3 the control unit 142 maintains the $\overline{\text{RD}}$ signal 126 in an active condition, and alternately rises up and falls down the IRD signal 122. As a result, the instruction pointer 208 is continuously updated, so that the instruction codes are uninterruptedly fetched from the memory 202 designated by the continuously updated instruction pointer 208, without a bus cycle for outputting an address for instruction code fetch from the microprocessor 100 to the memory chip 200.

During the period of the instruction code fetch cycle, the control unit 142 maintains the I/$\overline{\text{D}}$ signal 120 at a high level so that the bus interface 212 continues to select the instruction pointer 208 at the address source for the memory 202.

(2) Data read/write cycle

The data read/write cycle is composed of three timing periods T1, T2 and T3.

The control unit 142 of the microprocessor 100 rises up the ALE signal 124 in the timing period T1, in order to write an address information of the access destination to the address latch 206 of the memory chip 200. At the rise-up of the ALE signal 124, the bus interface 212 opens an input gate of the address latch 206, so that the data on the MAD bus 214 can be inputted to the address latch 206.

Then, in order to avoid contention with the preceding bus cycle, the control units 142 outputs the address information of the access destination in the memory 202 which is outputted to the address lines 152 from the execution unit 140, to the AD bus 102 from the latter half of the timing period T1, and at the same time brings the I/$\overline{\text{D}}$ signal 120 to a low level. Therefore, the address latch 206 is designated as the address source to the address decoder 204, and the address information on the AD bus 102 is outputted to the MAD bus 214, so that the address on the AD bus 102 is inputted to the address decoder 204 through the MAD bus 214 and the address latch 206.

Thereafter, the control unit 142 falls down the ALE signal 124 at the tail edge of the timing period T1. At this falling-down of the ALE signal 124, the bus interface 212 closes the input gate of the address latch 206, so that the address on the MAD bus 214 is latched into the address latch 206.

In the case of data read cycle, in the latter half of the timing period T2, the control unit 142 of the microprocessor 100 brings the AD bus 102 into a floating condition for preparation of the read cycle. Thereafter, during the timing period T3, the $\overline{\text{RD}}$ signal 126 is made active. With this, the bus interface 212 causes data to be outputted onto the AD bus 102 through the MAD bus 214 from a location of the memory 202 designated by the address latch 206.

At a predetermined clock during the timing period T3 at which the data read onto the AD bus becomes valid, the control unit 142 controls to fetch the data on the AD bus 102.

In the case of data write cycle, the control unit 142 outputs a write data onto the AD bus 102 from the latter half of the timing period T2, so that the data on the AD bus 102 is outputted on the MAD bus 214 in the memory chip 200.

Then, the control unit 142 of the microprocessor 100 makes the $\overline{\text{WR}}$ signal 128 active during the timing period T3. With this, during the timing period B3 at which the data on the AD bus 102 becomes valid, the bus interface 212 writes the data on the MAD bus 214 into the memory 202 at a location designated by the address latch 206.

During the period of the data read/write cycle, the control unit 142 maintains the I/$\overline{\text{D}}$ signal 120 at a low level, so that the bus interface 212 continues to select the address latch 206 as the address source for the memory 202.

(3) Branch processing cycle

The branch processing cycle is composed of three kinds of timing periods T1, T2 and T3.

The control unit 142 of the microprocessor 100 rises up the ALE signal 124 at the timing period T1.

Then, in order to avoid contention with the preceding bus cycle, the control unit 142 outputs the address of a branch destination in the memory 202 which is outputted from the execution unit 140 to the address lines 152, to the AD bus 102 from the latter half of the timing period T1, and at the same time brings the I/$\overline{\text{D}}$ 120 to a high level. Thus, the bus interface 212 outputs the address of the branch destination on the AD bus 102 to the MAD bus 214, and selects the instruction pointer 208 as the address source for the address decoder 204. In addition, when both the ALE signal 124 and the I/$\overline{\text{D}}$ signal 120 are brought into a high level, the bus interface 212 opens an input gate to the instruction pointer 208 from the MAD bus 214. As a result, the address of the branch destination of the MAD bus 214 is inputted to the instruction pointer 208. Specifically, the address of the branch destination on the AD bus 102 is outputted to the address decoder 204 through the MAD bus 214 and the instruction pointer 208.

Then, the control unit 142 falls down the ALE signal 124 at a tail edge of the timing period T2. At the falling-down of the ALE signal, the bus interface 212 closes the input gate of the instruction pointer 208, so that the address on the MAD bus 214 is latched to the instruction pointer 208.

Thereafter, the control unit 142 makes the $\overline{\text{RD}}$ signal 126 active during the timing period T3. As a result, the bus interface 212 causes to output an instruction code stored at the branch destination in the memory 202 designated by the instruction pointer 208, through the MAD bus 214 to the AD bus 102.

At a predetermined clock during the timing period T3 at which the instruction code on the AD bus 102 becomes valid, the control unit 142 causes the instruction queue 134 to fetch the instruction code on the AD bus 102, and at the same time falls down the IRD signal 122 in the latter half of the timing period T3 and then rises up the same IRD signal 122 again at the tail edge of the timing period T3.

Thus, the bus interface 212 of the memory chip 200 causes the address value of the instruction pointer 208 to be outputted to the incrementer 210 at the falling-down of the IRD signal 122 so that the incrementer 210 executes the increment operation. Then, at the rising-up of the IRD signal 122, the bus interface 212 causes a new address value obtained by the increment operation to be written into the instruction pointer 208 so that the instruction pointer 208 is updated.

Thereafter, by repeating the timing periods T3, the instruction code fetch cycle mentioned herebefore is continuously executed. Thus, the branch operation and the fetch of instruction codes from the branch destination are continuously executed.

During the branch processing cycle and the succeeding instruction code fetch cycle, the control unit 142 maintains the I/$\overline{\text{D}}$ signal 120 at a high level so that the bus interface 212 continues to select the instruction pointer 208 as the address source for the memory 202.

Next, the overall operation of the microcomputer system shown in FIG. 6 will be explained in the cases of (1) reset, (2) normal instruction execution, and (3) branch processing.

(1) Reset

If the reset signal 160 is made active in response to a reset instruction from an external, the control unit 142 initialized the program counter 130. For control of the bus cycle, the control unit 142 continues to output the T1 signal until the reset signal 160 is rendered inactive, so that the bus cycle is maintained in an idle condition. In addition, the instruction queue 134 is flashed so that the queue is put in a perfectly empty condition and the QRDY signal 156 is made inactive.

When the reset signal 160 is rendered inactive, the control unit 142 starts the branch processing cycle. At this time, the initial value of the program counter 130 is outputted as the branch destination address to the AD bus 102. After completion of the branch processing cycle, the control unit 142 continuously executes the instruction code fetch cycles, so that the instruction queue 134 fetches instruction codes from the memory 202.

(2) Normal instruction execution

If the QRDY signal 156 from the instruction queue 134 become active, an instruction code is read from a head of the instruction queue 134 and fetched to the instruction register 136. The value of the program counter 130 is incremented by the incrementer 132 at each time the instruction code is read from the instruction queue 134. The instruction code fetched in the instruction register 136 is decoded by the instruction decoder 138, and then, the instruction is executed by the execution unit 140 on the basis of signals outputted from the instruction decoder 138.

In the course of the instruction execution, if it becomes necessary to perform a data read/write between the microprocessor and the memory 202, the microprocessor 100 computes an address of the memory 202 for the data read/write, and thereafter, makes the BRQ signal 150 active and outputs an address of the access destination to the address lines 152. Then, the execution unit 140 requests the control unit 142 to start the data read/write cycle.

After completion of the bus cycle being executed at that time (if it is), the control unit 142 makes the ACK signal 154 active, so that it grants the start request of the data read/write cycle from the execution unit 140 and immediately starts the data read/write cycle.

(3) Branch processing

In the case of an branch instruction, the execution unit 140 performs a branch destination address calculation and a branch decision. If it is judged to perform a branch, the branch destination address is written into the program counter, and the BR signal 148 is rendered active. Thus, the address of the branch destination in the memory 202 is outputted to the address lines 152, and the start of the branch processing cycle is requested to the control unit 142.

The control unit 142 makes the ACK signal 154 active after completion of the bus cycle being executed at that time (if it is), and grants the start request of the branch processing cycle from the execution unit 140, so as to immediately start the branch processing cycle.

On the other hand, the instruction queue 134 is flashed to an empty condition, and therefore, the QRDY signal 156 is rendered inactive.

If the branch processing cycle is completed, the control unit 142 continuously executes the instruction code fetch cycles, so that the instruction codes stored at the branch destination in the memory 202 are fetched to the instruction queue 134.

Figure 10:
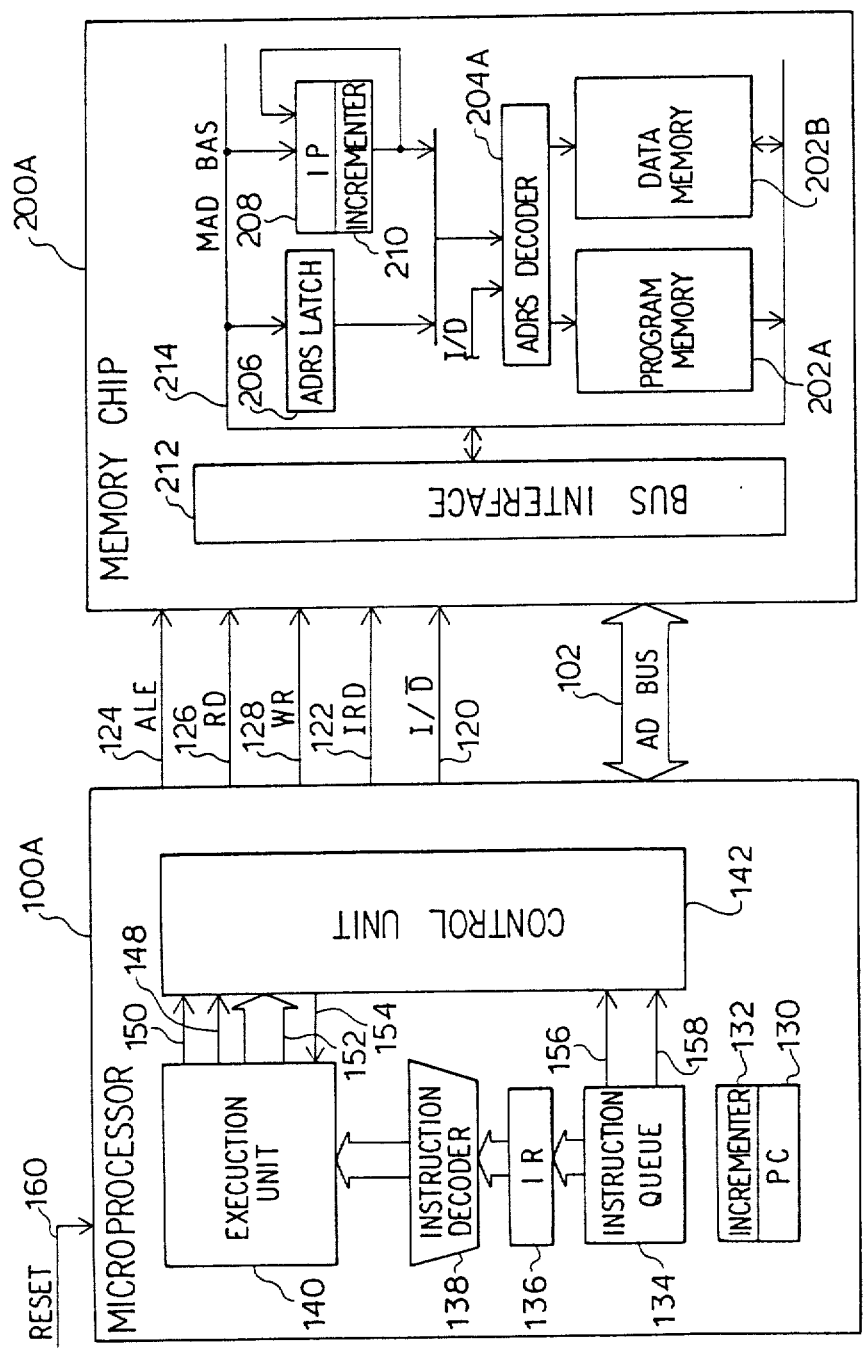
FIG. 10 is a block diagram of a second embodiment of the microprocessor system in accordance with the present invention.

Turning to FIG. 10, there is shown another embodiment of the microprocessor in accordance with the present invention.

The shown microcomputer system includes a microprocessor chip 100A for controlling input/output of data, arithmetic and logic operation and whole operation of the overall microcomputer system, and a memory chip 200A containing therein a program memory 202A for storing programs executed by the microprocessor 100A and a data memory 202B for storing the processing data necessary for the execution of the instructions.

The microprocessor 100A has the same hardware construction as that of the microprocessor 100 shown in FIG. 6. Therefore, the same elements are given the same reference numerals and explanation will be omitted. But, in the address space, a program space and a data are distinguished from each other, so that the microprocessor 100A have an address space twice of the microprocessor 100.

The memory chip 200A has a construction substantially similar to the memory chip 200 except for the following points. Specifically, to comply with the address space in the microprocessor 100A, the program memory 202A corresponds to the program space and the data memory 202B corresponds to the data space. In order to discriminate whether a given address value is directed to the program space or the data space, an address decoder 204A is adapted to receive the I/$\overline{D}$ signal 120 from the microprocessor 100A. The address decoder 204A outputs its decoded address to the program memory 202A in the case of a high level I/$\overline{D}$ signal 120 and to the data memory 202B in the case of a low level I/$\overline{D}$ signal 120. The other elements which are the same as the corresponding elements in the memory chip 200, are given the same reference numerals and explanation will be omitted.

Now, operation of the microcomputer system shown in FIG. 10 will be explained in the cases of an instruction code fetch cycle and a data read cycle.

(1) Instruction code fetch cycle

The instruction code fetch cycle is composed of one timing period T1 and continuous timing periods T3.

The control unit 142 of the microprocessor 100A makes all the control signals inactive in order to avoid contention with the preceding bus cycle.

Then, the control unit 142 brings the I/$\overline{D}$ signal 120 to the high level at the latter half of the timing period T1. As a result, the instruction pointer 208 is selected as an address source to the memories 202A and 202B of the memory chip 200A, and so, the bus interface 212 controls to cause the value of the instruction pointer 208 to be coupled to the address decoder 204A. At this time, since the I/$\overline{D}$ signal 120 is at a high level, the decoder 204A outputs the decoded data to the program memory.

Further, the control unit 142 makes the $\overline{RD}$ signal active during the timing periods T3, so that the bus interface 212 outputs the instruction code stored in the program memory 202A and designated by the instruction pointer 208, through the MAD bus 214 to the AD bus 102.

At a predetermined clock during the timing period T3 at which the instruction code read onto the AD bus 102 becomes valid, the control unit 142 causes the instruction queue 134 to fetch the instruction code on the AD bus 102. At the same time, the control unit 142 falls down the IRD signal 122 in the latter half of the timing period T3, and then rises up the same IRD signal 122 at the trial edge of the timing period T3 again.

Thus, the bus interface 212 of the memory chip 200A causes the address value of the instruction pointer 208 to be outputted to the incrementer 210 at the falling-down of the IRD signal 122 so that the incrementer 210 executes the increment operation. Then, at the rising-up of the IRD signal 122, the bus interface 212 causes a new address value obtained by the increment operation to be written into the instruction pointer 208 so that the instruction pointer 208 is updated.

Thereafter, during the continuous timing periods T3 the control unit 142 maintains the $\overline{RD}$ signal 126 in an active condition, and alternately rises up and falls down the IRD signal 122. As a result, the instruction pointer 208 is continuously updated, so that instruction codes are uninterruptedly fetched from the program memory 202A designated by the continuously updated instruction pointer 208, without a bus cycle for outputting an address for instruction code fetch.

During the period of the instruction code fetch cycle, the control unit 142 maintains the I/$\overline{D}$ signal 120 at a high level so that the bus interface 212 continues to select the instruction pointer 208 as the address source for the program memory 202A.

(2) Data read/write cycle

The data read/write cycle is composed of three timing periods T1, T2 and T3.

The control unit 142 of the microprocessor 100A rises up the ALE signal 124 in the timing period T1, in order to write an address information of the access destination to the address latch 206 of the memory chip 200A. At the rise-up of the ALE signal 124, the bus interface 212 opens an input gate of the address latch 206, so that the data on the MAD bus 214 can be inputted to the address latch 206.

Then, in order to avoid contention with the preceding bus cycle, the control units 143 outputs the address information of the access destination in the data memory 202B which is outputted to the address lines 152 from the execution unit 140, to the AD bus 102 from the latter half of the timing period T1, and at the same time brings the I/$\overline{D}$ signal 120 to a low level. Therefore, the address latch 206 is designated as the address source to the address decoder 204, and the address information on the AD bus 102 is outputted to the MAD bus 214, so that the address on the AD bus 102 is inputted to the address decoder 204 through the MAD bus 214 and the address latch 206. At this time, since the I/$\overline{D}$ signal 120 is at a low level, the address decoder 204A selects the data memory 202B as an supply destination of the decoded result.

Thereafter, the control unit 142 falls down the ALE signal 124 at the tail edge of the timing period T1. At this falling-down of the ALE signal 124, the bus interface 212 closes the input gate of the address latch 206, so that the address on the MAD bus 214 is latched into the address latch 206.

In the case of the data read cycle, in the latter half of the timing period T2, the control unit 142 brings the AD bus 102 into a floating condition for preparation of the read cycle. Thereafter, during the timing period T3, the $\overline{RD}$ signal 126 is made active. With this, the bus interface 212 causes data to be outputted onto the AD bus 102 through the MAD bus 214 from a location of the data memory 202B designated by the address latch 206.

At a predetermined clock during the timing period T3 at which the data read onto the AD bus becomes valid, the control unit 142 controls to fetch the data on the AD bus 102.

In the case of data write cycle, the control unit 142 outputs a write data onto the AD bus 102 from the latter half of the timing period T2, so that the data on the AD bus 102 is outputted on the MAD bus 214 in the memory chip 200.

Then, the control unit 142 makes the $\overline{WR}$ signal 128 active during the timing period T3. With this, during the timing period B3 at which the data on the AD bus 102 becomes valid, the bus interface 212 writes the data on the MAD bus 214 into the data memory 202B at a location designated by the address latch 206.

During the period of the data read/write cycle, the control unit 142 maintains the I/$\overline{D}$ signal 120 at a low level, so that the bus interface 212 continues to select the address latch 206 as the address source for the data memory 202B.

The above mentioned embodiments of the microcomputer system comprises a microprocessor and a memory chip which has on a single semiconductor substrate a pointer for indicating an address of an instruction code fetch destination, an incrementer for incrementing the pointer and a memory for storing programs and data. The microprocessor controls the update timing of the pointer in the memory chip, so that the instruction codes can be continuously read from the memory of the memory chip without outputting the addresses of the instruction code fetch destination from the microprocessor. Thus, the following advantages can be obtained.

(1) Since the instruction pointer continuously incremented by the incrementer continuously generates the read addresses for the memory storing the instruction codes, the microprocessor is not required to start the bus cycle for outputting the address of the fetch destination. Therefore, since the required number of bus cycles is decreased, the instruction code fetch cycle can be speeded up, and therefore, the possibility of the bus neck is decreased, whereby the instruction execution speed of the overall system can be increased.

(2) Since the instruction code fetch cycle is sped up, the prefetch effect of the instruction codes given by the instruction queue provided in the microprocessor can be emphasized by supplying a necessary and sufficient number of instruction codes to the microprocessor. In this point, the occurrence of the bus neck can be further decreased.

(3) At the time of resetting and in the case of the branch processing, the writing to the instruction pointer of the read address for the instruction code memory and the fetch of the instruction code from the memory designated by the instruction pointer are continuously executed. Therefore, the execution time of the ready operation after the resetting and the execution time of the branch instruction can be shortened.

(4) There are installed on a single chip the pointer for indicating the program address of the instruction code fetch destination, the incrementer for incrementing the pointer, the address latch for holding the data address, and the memory for storing the programs and data. Therefore, it is not necessary to provide additional hardwares such as a latch and a driver between the microprocessor and the memory, and so, the microprocessor is directly coupled to the memory. Accordingly, a very small-scaled microcomputer system can be obtained with an improved reliability.

As will be apparent from the above explanation, in accordance with the present invention, the instruction code fetch cycle is sped up and the bus usage efficiency for the memory access can be improved. Accordingly, the occurrence of the bus neck is minimized, and the effect of the instruction code prefetch used in a pipelined architecture is enhanced. Further, the reliability and the economic factor are greatly improved.

The invention has thus been shown and described with reference to the specific embodiments. However, it should be noted that the invention is in no way limited to the details of the illustrated structures but changes and modifications may be made within the scope of the appended claims.

We claim:

1. A microcomputer system comprising a microprocessor and a memory chip coupled to the microprocessor though an address/data bus and various control signal lines;

said microprocessor being configured to output an address and data through said address/data bus to said memory chip and also to fetch an instruction code and data through said address/data bus from said memory chip, said microprocessor operating to output an address latch signal, a read signal, a write signal, an instruction/data signal and an instruction read signal through said control signal lines to said memory chip;

said memory chip including:

memory means for storing programs and data and being coupled to receive data from said address/data bus and to output an instruction code and data to said address/data bus, an address latch coupled to latch an address on said address/data bus in response to said address latch signal, an instruction pointer holding an address for an instruction code, an update means coupled to said instruction pointer and operating to output an updated address obtained by changing the address held in said instruction pointer by a predetermined number in response to each instruction read signal when said instruction/data signal designates an instruction, said instruction pointer being updated with said updated address outputted from said update means, selection means coupled to receive the address latched in said address latch and said updated address outputted from said update means and controlled by said instruction/data signal so as to output the address latched in said address latch when said instruction/data signal designates data and said updated address outputted from said update means when said instruction/data signal designates an instruction, and decode means coupled to receive the address outputted from said selection means and to output a decoded address to said memory means so that an instruction code or data is read from said memory means in accordance with the decoded address or data is written to said memory means in accordance with the decoded address, whereby said system being operative such that:

when data is written to said memory means, said microprocessor operates to output an address through said address/data bus to said memory chip and also to output such address latch signal to said memory chip so as to cause the address on said address/data bus to be latched in said address latch of said memory chip, and thereafter, to output data through said address/data bus to said memory chip and also to output said instruction/data signal designating the data and said write signal to said memory chip so that the address latched in said address latch is outputted from said selection means and the data on said address/data bus to be written into said memory means in accordance with the address latched in said address latch;

when data is read from said memory means, said microprocessor operates to output an address through said address/data bus to said memory chip and also to output said address latch signal to said memory chip so as to cause the address on said address/data bus to be latched in said address of said memory chip, and thereafter, to output data through said address/data bus to said memory chip and also to output said instruction/data signal designating the data and said write signal to said memory chip so that the address latched in said address latch is outputted from said selection means and the data on said address/data bus to be written into said memory means in accordance with the address latched in said address latch;

when data is read from said memory means, said microprocessor operates to output an address through said address/data bus to said memory chip and also to output said address latch signal to said memory chip so as to cause the address on said address/data bus to be latched in said address latch of said memory chip, and thereafter, to output said instruction/data signal designating the data and said read signal to said memory chip so that the address latched in said address latch is outputted from said selection means and data is read from said memory means in accordance with the address latched in said address latch so as to be outputted through said address/data bus to said microprocessor; and when instruction codes are read from said memory means, said microprocessor operates to output said instruction/data signal designating the instruction and said read signal to said memory chip and also to intermittently and sequentially output said instruction read signal to said memory chip so that at each time said instruction read signal is outputted from said microprocessor, and address held in said instruction pointer is updated, and an instruction code is read from said memory means in accordance with the updated address, with the result that instruction codes are continuously read from said memory means through said address/data bus to said microprocessor with no address supplied from said microprocessor.

2. A microcomputer system as claimed in claim 1, wherein said update means includes an incrementer coupled to receive the address held in said instruction pointer and to increment the received address in response to each instruction read signal when said instruction/data signal designates an instruction, said instruction pointer being updated with an incremented address outputted from said incrementer.

3. A microcomputer system as claimed in claim 1, wherein said memory chip further includes interface means coupled to said address/data bus, and an internal memory address/data bus coupled to said interface means, said memory means being coupled to said internal memory address/data bus so as to receive the data through said interface means from said address/data bus and to output the instruction code and data through said interface means to said address/data bus, and said address latch being coupled to said internal memory address/data bus so as to receive the address on said address/data bus through said interface means.

4. A microcomputer system as claimed in claim 3, wherein said instruction pointer is coupled to said internal memory address/data bus so as to apply to said internal memory address/data bus start address for a series of continuous instruction codes.

5. A microcomputer system as claimed in claim 1, wherein said memory means includes a program memory and a data memory which are coupled to receive the address outputted from said decode means, said decode means being connected to receive said instruction/data signal and operating to output the decoded address to said data memory when said instruction/data signal designates the data and to program memory when said instruction/data signal designates the instruction.

6. A microcomputer system comprising a microprocessor and a memory chip coupled to the microprocessor through an address/data bus and various control signal lines;
   said microprocessor being configured to output an address and data through said address/data bus to said memory chip and also to fetch an instruction code and data through said address/data bus from said memory chip, said microprocessor operating to output an address latch signal, a read signal, a write signal, an instruction/data signal and an instruction read signal through said control signal lines to said memory chip;
   said memory chip including:
   memory means for storing programs and data and being coupled to receive data from said address/data bus and to output an instruction code and data to said address/data bus,
   an address latch coupled to latch an address on said address/data bus in response to said address latch signal,
   an instruction pointer for holding an address for an instruction code and coupled to latch an address on said address/data bus in response to said instruction/data signal designating an instruction,
   an update means coupled to said instruction pointer and operating to output an updated address obtained by changing the address held in said instruction pointer by a predetermined number in response to each instruction read signal when said instruction/data signal designates an instruction, said instruction pointer being updated with said updated address outputted from said update means,
   selection means coupled to receive the address latched in said address latch and said updated address outputted from said update means and controlled by said instruction/data signal so as to output the address latched in said address latch when said instruction/data signal designates data and said updated address outputted from said update means when said instruction/data signal designates an instruction, and
   decode means coupled to receive the address outputted from said selection means and to output a decoded address to said memory means so that an instruction code or data is read from said memory means in accordance with the decoded address or data is written to said memory means in accordance with the decoded address; whereby
   said system being operative such that:
   when data is written to said memory means, said microprocessor operates to output an address through said address/data bus to said memory chip and also to output said address latch signal to said memory chip so as to cause the address on said address/data bus to be latched in said address latch of said memory chip, and thereafter, to output data through said address/data bus to said memory chip and also to output said instruction/data signal designating the data and said write signal to said memory chip so that the address latched in said address latch is outputted from said selection means and the data on said address/data bus to be written into said memory means in accordance with the address latched in said address latch;
   when data is read from said memory means, said microprocessor operates to output an address through said address/data bus to said memory chip and also to output said address latch signal to said memory chip so as to cause the address on said address/data bus to be latched in said address latch of said memory chip, and thereafter, to output said instruction/data signal designating the data and said read signal to said memory chip so that the address latched in said address latch is outputted from said selection means and data is read from said memory means in accordance with the address latched in said address latch so as to be outputted through said address/data bus to said microprocessor; and
   when a branch operation is performed, said microprocessor operates to output a branch address through said address/data bus to said memory chip and also to output said instruction/data signal designating the instruction to said memory chip so as to cause the address on said address/data bus to be latched in said instruction pointer of said memory chip, and thereafter, to maintain said instruction/data signal designating the instruction, to output said read signal to said memory chip and also to intermittently and sequentially output said instruction read signal to said memory chip so that at each time said instruction read signal is outputted from said microprocessor, said address held in said instruction pointer is updated, and an instruction code is read from said memory means in accordance with the updated address, with the result that instruction codes starting at said branch address are continuously read from said memory means through said address/data bus to said microprocessor with no address upplied from said microprocessor.

7. A microcomputer system as claimed in claim 6, wherein said update means includes an incrementer coupled to receive the address held in said instruction pointer and to increment the received address in response to each instruction read signal when said instruction/data signal designates an instruction, said instruction pointer being updated with an incremented address outputted from said incrementer.

8. A microcomputer system as claimed in claim 6, wherein said memory chip further includes interface means coupled to said address/data bus, and an internal memory address/data bus coupled to said interface means, said memory means being coupled to said internal memory address/data bus so as to receive the data through said interface means from said address/data bus and to output the instruction code and data through said interface means to said address/data bus, and said address latch being coupled to said internal memory address/data bus so as to receive the address on said address/data bus through said interface means.

9. A microcomputer system as claimed in claim 8, wherein said instruction pointer is coupled to said internal memory address/data bus so as to apply to said internal memory address/data bus said branch address.

10. A microcomputer system as claimed in claim 6, wherein said memory means includes a program memory and a data memory which are coupled to receive the address outputted from said decode means, said decode means being connected to receive said instruction/data signal and operating to output the decoded address to said data memory when said instruction/data signal designates the data and to program memory when said instruction/data signal designates the instruction.

11. A microcomputer system comprising a microprocessor and a memory chip coupled to the microprocessor through an address/data bus and various control signal lines;

said microprocessor being configured to output an address and data through said address/data bus to said memory chip and also to fetch an instruction code and data through said address/data bus from said memory chip, said microprocessor operating to output an address latch signal, a read signal, a write signal, an instruction/data signal and an instruction read signal through said control signal lines to said memory chip;

said memory chip including:

memory means for storing programs and data and being coupled to receive data from said address/data bus and to output an instruction code and data to said address/data bus, an address latch coupled to latch an address on said address/data bus in response to said address latch signal, an instruction pointer for holding an address for an instruction code and coupled to latch an address on said address/data bus in response to said instruction/data signal designating an instruction, an update means coupled to said instruction pointer and operating to output an updated address obtained by changing the address held in said instruction pointer by a predetermined number in response to each instruction read signal when said instruction/data signal designates an instruction, said instruction pointer being updated with said updated address outputted from said update means, selection means coupled to receive the address latched in said address latch and said updated address outputted from said update means and controlled by said instruction/data signal so as to output the address latched in said address latch when said instruction/data signal designates data and said updated address outputted from said update means when said instruction/data signal designates an instruction, and decode means coupled to receive the address outputted from said selection means and to output a decoded address to said memory means so that an instruction code or data is read from said memory means in accordance with the decoded address or data is written to said memory means in accordance with the decoded address, whereby said system being operative such that:

when data is written to said memory means, said microprocessor operates to output an address through said address/data bus to said memory chip and also to output said address latch signal to said memory chip so as to cause the address on said address/data bus to be latched in said address latch of said memory chip, and thereafter, to output data through said address/data bus to said memory chip and also to output said instruction/data signal designating the data and said write signal to said memory chip so that the address latched in said address latch is outputted from said selection means and the data on said address/data bus to be written into said memory means in accordance with the address latched in said address latch;

when data is read from said memory means, said microprocessor operates to output an address through said address/data bus to said memory chip and also to output said address latch signal to said memory chip so as to cause the address on said address/data bus to be latched in said address latch of said memory chip, and thereafter, to output said instruction/data signal designating the data and said read signal to said memory chip so that the address latched in said address latch is outputted from said selection means and data is read from said memory means in accordance with the address latched in said address latch so as to be outputted through said address/data bus to said microprocessor;

when instruction codes are read from said memory means, said microprocessor operates to output said instruction/data signal designating the instruction and said read signal to said memory chip and also to intermittently and sequentially output said instruction read signal to said memory chip so that at each time said instruction read signal is outputted from said microprocessor, said address held in said instruction pointer is updated, and an instruction code is read from said memory means in accordance with the updated address, with the result that instruction codes are continuously read from said memory means through said address/data bus to said microprocessor with no address supplied from said microprocessor; and when a branch operation is performed, said microprocessor operates to output a branch address through said address/data bus to said memory chip and also to output said instruction/data signal designating the instruction to said memory chip so as to cause the address on said address/data bus to be latched in said instruction pointer of said memory chip, and thereafter, to maintain said instruction/data signal designating the instruction, to output read signal to said memory chip and also to intermittently and sequentially output said instruction read signal to said memory chip so that at each time said instruction read signal is outputted from said microprocessor, said address held in said instruction pointer is updated, and an instruction code is read from said memory means in accordance with the updated address, with the result that instruction codes starting at said branch address are continuously read from said memory means through said address/data bus to said microprocessor with no address supplied from said microprocessor.

12. A microprocessor system as claimed in claim 11, wherein said update means includes an incrementer coupled to receive the address held in said instruction pointer and to increment the received address in response to each instruction read signal when said instruction/data signal designates an instruction, said instruction pointer being updated with an incremented address outputted from said incrementer.

13. A microcomputer system as claimed in claim 11, wherein said memory chip further includes interface means coupled to said address/data bus, and an internal memory address/data bus coupled to said interface means, said memory means being coupled to said internal memory address/data bus so as to receive the data through said interface means from said address/data bus and to output the instruction code and data through said interface means to said address/data bus, and said address latch being coupled to said internal memory address/data bus so as to receive the address on said address/data bus through said interface means.

14. A microcomputer system as claimed in claim 13, wherein said instruction pointer is coupled to said internal memory address/data bus so as to apply to said internal memory address/data bus said branch address.

15. A microcomputer system as claimed in claim 11, wherein said memory means includes a program memory and a data memory which are coupled to receive the address outputted from said decode means, said decode means being connected to receive said instruction/data signal and operating to output the decoded address to said data memory when said instruction/data signal designates the data and to program memory when said instruction/data signal designates the instruction.

16. A memory chip coupled to an address/data bus so as to receive an address and data and to output an instruction code and data in response to various control signals including an address latch signal, a read signal, a write signal, an instruction/data signal and an instruction read signal, comprising:

memory means for storing programs and data and being coupled to receive data from said address/data bus and to output an instruction code and data to said address/data bus, an address latch coupled to latch an address on said address/data bus in response to said address latch signal, an instruction pointer holding an address for an instruction code, an update means coupled to said instruction pointer and operating to output an updated address obtained by changing the address held in said instruction pointer by a predetermined number in response to each instruction read signal when said instruction/data signal designates an instruction, said instruction pointer being updated with said updated address outputted from said update means, selection means coupled to receive the address latched in said address latch and said updated address outputted from said update means and controlled by said instruction/data signal so as to output the address latched in said address latch when said instruction/data signal designates an instruction, and decode means coupled to receive the address outputted from said selection means and to output a decoded address to said memory means so that an instruction code or data is read from said memory means in accordance with the decoded address or data is written to said memory means in accordance with the decoded address, whereby said system being operative such that:

when data is written to said memory means, the memory chip receives an address through said address/data bus and said address latch signal so that the address on said address/data bus is latched in said address latch, and thereafter, the memory chip receives data through said address/data bus and also receives said instruction/data signal designating the data and said write signal so that the address latched in said address latch is outputted from said selection means and the data on said address/data bus to be written into said memory means in accordance with the address latched in said address latch;

when data is read from said memory means, the memory chip receives an address through said address/data bus and said address latch signal so that the address on said address/data bus is latched in said address latch, and thereafter, the memory chip receives said instruction/data signal designating the data and said read signal so that the address latched in said address latch is outputted from said selection means and data is read from said memory means in accordance with the address latched in said address latch so as to be outputted through said address/data bus to said microprocessor; and when instruction codes are read from said memory means, the memory chip receives said instruction/data signal and also receives intermittently and sequentially said instruction read signal so that at each time said instruction read signal is received, said address held in said instruction pointer is updated, and an instruction code is read from said memory means in accordance with the updated address, with the result that instruction codes are continuously read from said memory means through said address/data bus with no address supplied from an external device.

17. A memory chip as claimed in claim 16, wherein said update means includes an incrementer coupled to receive the address held in said instruction pointer and to increment the received address in response to each instruction read signal when said instruction/data signal designates an instruction, said instruction pointer being updated with an incremented address outputted from said incrementer.

18. A memory chip as claimed in claim 16, further including interface means coupled to said address/data bus, and an internal memory address/data bus coupled to said interface means, said memory means being coupled to said internal memory address/data bus so as to receive the data through said interface means from said address/data bus and to output the instruction code and data through said interface means to said address/data bus, and said address latch being coupled to said internal memory address/data bus so as to receive the address on said address/data bus through said interface means.

19. A memory chip as claimed in claim 18, wherein said instruction pointer is coupled to said internal memory address/data bus so as to apply to said internal memory address/data bus start address for a series of continuous instruction codes.

20. A memory chip as claimed in claim 16, wherein said memory means includes a program memory and a data memory which are coupled to receive the address outputted from said decode means, said decode means being connected to receive said instruction/data signal and operating to output the decoded address to said data memory when said instruction/data signal designates the data and to program memory when said instruction/data signal designates the instruction.

* * * * *